United States Patent [19]

Kim et al.

[11] Patent Number: 5,640,360
[45] Date of Patent: Jun. 17, 1997

[54] ADDRESS BUFFER OF SEMICONDUCTOR MEMORY DEVICE

[75] Inventors: Gyu-Hong Kim; Jin-Man Han; Hyung-Dong Kim, all of Seoul, Rep. of Korea

[73] Assignee: Samsung Electronics Co., Ltd., Suwon, Rep. of Korea

[21] Appl. No.: 591,118

[22] Filed: Jan. 25, 1996

[30] Foreign Application Priority Data

Jan. 25, 1995 [KR] Rep. of Korea ............... 95-1483

[51] Int. Cl.⁶ .......................................... B11C 8/00
[52] U.S. Cl. .................. 365/230.08; 365/222; 365/233
[58] Field of Search ....................... 365/230.08, 222, 365/233

[56] References Cited

U.S. PATENT DOCUMENTS 5,537,564  7/1996  Hazanchuk et al. ............ 365/230.08

Primary Examiner—Joseph E. Clawson, Jr.
Attorney, Agent, or Firm—Cushman Darby & Cushman, IP Group Of Pillsbury Madison & Sutro LLP

[57] ABSTRACT

An address buffer circuit for a semiconductor memory device includes first and second address inputs which are selectably connectable to a first node according to first and second address input control signals, respectively. The device also includes first and second switches which are controlled by a refresh mode signal and selectively output a first or second address enable signal. Further, a latch is provided which latches the address signal input to the first node, and outputs the latched address signal in periods of the selected first or second address enable signals.

13 Claims, 3 Drawing Sheets

ADDRESS BUFFER OF SEMICONDUCTOR MEMORY DEVICE

BACKGROUND OF THE INVENTION

1. Field of the invention

The present invention relates to an address buffer circuit of a semiconductor memory device, and more particularly, to an address buffer circuit capable of selectively inputting a plurality of address signals.

2. Description of the related art

High integration and high-speed operation are required in semiconductor memory devices. However, high integration has required operating voltages within semiconductor memory devices. This, in turn, has caused reaction speed with respect to input signals to decrease, and accordingly, render it difficult to achieve the high-speed operation in the semiconductor memory device.

Furthermore, in semiconductor memory devices, each different address can be used for a plurality of modes. For example, a dynamic random access device contains a normal mode (read mode & write mode) and a CBR mode (CAS Before RAS mode, wherein, CAS: Column Address Strobe and RAS: Row Address Strobe), and inputs different kinds of addresses according to the characteristics of each mode to thereby select memory cells corresponding to the input addresses.

The normal mode includes a read and write mode for selecting memory cells corresponding to addresses input from outside of the semiconductor memory device. In this normal mode, a CAS signal is enabled after a RAS signal is enabled. The CBR mode executes a refresh mode. In the refresh mode, refresh address signals generated from an internal counter are input and memory cells corresponding to the input refresh addresses are selected. The generation speed of refresh address signals is slower than that of normal read and write address signals. Since the same address buffer circuit is commonly used for both normal and refresh modes, the slower refresh address signals disturb the speed of address buffer circuit.

FIG. 1 shows the address buffer circuit of one conventional dynamic random access memory device, and hereinafter operations in the normal mode and the refresh mode will be explained.

A resistor 22 is connected to a power supply voltage $V_{CC}$. A PMOS transistor 11 is connected between the resistor 22 and a node N11, and has its gate electrode connected to an external address signal AI. A NMOS transistor 12 is connected between the node N11 and a node N12, and has its gate electrode connected to a row address enable signal PRAE. An NMOS transistor 13 is connected between the node N12 and a node N13, and has its gate electrode connected to the external address signal AI. An NMOS transistor 14 is connected between the node N13 and a ground potential $V_{SS}$, and has its gate electrode connected to a row address strobe signal PRASB. A PMOS transistor 15 is connected between the power supply voltage $V_{CC}$ and the node N11, and has its gate electrode connected to the row address enable signal PRAE. A PMOS transistor 16 is connected between the power supply voltage $V_{CC}$ and the node N11, and has its gate electrode connected to the row address strobe signal PRASB. An inverter 21 inverts the row address strobe signal PRASB. A PMOS transistor 17 is connected between the power supply voltage $V_{CC}$ and a node N14, and has its gate electrode connected to an output terminal of the inverter 21. A PMOS transistor 18 is connected between the node N14 and a node N1, and has its gate electrode connected to the node N11. An NMOS transistor 19 is connected between the node N1 and a node N15, and has its gate electrode connected to the node N11. An NMOS transistor 20 is connected between the node N15 and the ground voltage $V_{SS}$, and connected to the row address strobe signal PRASB at a gate electrode thereof. The construction as described above is used as a first input of the external address signal AI in the normal mode.

Operation of the first input will now be explained. An input margin of the external address signal AI is designated by the row address enable signal PRAE and the row address strobe signal PRASB which are used as external address input control signals.

In an initial state, the row address enable signal PRAE is in a logic "low" state and the row address strobe signal PRASB is in a logic "high" state. In this case, the NMOS transistor 12 is turned off and the PMOS transistor 15 is turned on, and therefore, the node N11 is charged to a level of the power supply voltage $V_{CC}$. Accordingly, since the NMOS transistor 12 is in the turned-off state, the external address signal AI is not input. Further, since the row address strobe signal PRASB with a logic "high" state is input, the PMOS transistor 16 is turned off and the NMOS transistor 20 is turned on. Because the PMOS transistor 17, which is connected to the inverter 21 at the gate electrode thereof, is in the turned-on state, the potential of the power supply voltage $V_{CC}$ is generated at the node N1.

If the row address enable signal PRAE is then changed to a logic "high" state, the NMOS transistor 12 is turned on and the PMOS transistor 15 is turned off. Accordingly, an input path of the external address signal AI is formed. If the external address signal AI is input as a logic "high" state, the PMOS transistor 11 is turned off and the NMOS transistor 13 is turned on. Therefore, a logic "low" potential is generated at the node N11. Then, the PMOS transistor 18 and the NMOS transistor 19, which have their gate electrodes connected in common to the node N11, are respectively turned on and off, and the power supply voltage potential $V_{CC}$ is generated at the node N1.

Alternatively, if the external address signal AI is input at a logic "low" level, the PMOS transistor 11 is turned on and the NMOS transistor 13 is turned off. Therefore, the power supply voltage potential $V_{CC}$ will be generated at the node N11. The PMOS transistor 18 and the NMOS transistor 19, which have their gate electrodes connected to the node N11 are thereby respectively turned off and on, to generate a logic "low" potential (ground potential) at the node N1.

Thus, if the row address enable signal PRAE is changed to the logic "high" state, the first input is enabled, thereby outputting a logic signal corresponding to the node N1 according to the logic of the input external address signal AI. However, if the row address strobe signal PRASB is changed to the logic "low" state, the NMOS transistor 14 is turned off and the PMOS transistor 16 is turned on, causing the input path of the external address signal AI to be cut off and causing the node N11 to be charged to the power supply voltage $V_{CC}$ level. Additionally, the NMOS transistor 20 is turned off and the PMOS transistor 17 is also turned off by the inverter 21, thereby disconnecting the paths of the first input and the node N1.

Therefore input of the external address signal AI is enabled from the time when the row address enable signal PRAE is changed to the logic "high" state to the time when the row address strobe signal PRASB is changed to the logic "low" state. During this period, the external address signal AI is input.

A second input for inputting the counter output CNT will now be described. An inverter 31 inverts a row count PRCNT to thereby output the inverted result to a node N21. A transmission gate 32 includes NMOS and PMOS transistors which are connected between an input terminal of a counter output CNT and a node N22. In transmission gate 32, a gate electrode of the NMOS transistor is connected to the node N21 and a gate electrode of the PMOS transistor is connected to the row count PRCNT. Accordingly, the transmission gate 32 is turned on when the row count PRCNT maintains the logic "low" state, and will transmit the counter output CNT to the node N22.

An inverter 33 is connected between the nodes N22 and N23, and an inverter 34 is connected between the nodes N23 and N22. The inverters 33 and 34 are used as a latch for the signal from node N22. A transmission gate 35 includes NMOS and PMOS transistors which are connected between the nodes N23 and N1. In this transmission gate 35, a gate electrode of the PMOS transistor is connected to the node N21 and a gate electrode of the NMOS transistor is connected to the row count PRCNT. Accordingly, the transmission gate 35 is turned on when the row count PRCNT maintains the logic "high" state, and transmits the counter output CNT being latched at the node N23 to the node N1.

In this second input, if the row count PRCNT is input as a logic "low" state, the transmission gate 32 is turned on and the transmission gate 35 is turned off. Accordingly, if the row count PRCNT is a logic "low", the transmission gate 32 transmits the input counter output CNT to the node N22, and the inverters 33 and 34 latch the counter output CNT which is transmitted to the node N22 to the node N23. Since the transmission gate 35 is in the turned-off state, the counter output CNT latched to the node N23 is cut off and not transmitted to the node N1.

However, the row count PRCNT is then changed to a logic "high" state, the transmission gate 32 is turned off and the transmission gate 35 is turned on. Accordingly, if the row count PRCNT is in the logic "high" state, the transmission gate 32 prevents the counter output CNT from being input, and the transmission gate 35 transmits the counter output CNT latched to the node N23 to the node N1.

Construction of an address input will now be described. An inverter 51 is connected between the node N1 and a node N31, and an inverter 52 is connected between the nodes N31 and N1. The inverters 51 and 52, which are used as a latch, latch an address signal of the node N1 to the node N31. A NAND gate 54 inputs an address signal of the node N31 and an address enable signal PRAR to thereby NAND the input signals. The inverter 53 inverts the address signal of the node 31 to thereby output the inverted address signal. A NAND gate 55 inputs an output of the inverter 53 and the address enable signal PRAR to thereby NAND the input signals. An inverter 56 inverts an output of the NAND gate 54 to thereby output the inverted result as a second row address input RAIB. An inverter 57 inverts an output of the inverter 55 to thereby output the inverted output as a first row address signal input RAI.

Operation of the address output will now be described. The external address signal AI or counter output CNT input to the node N1 is latched to the node N31 by the inverters 51 and 52. At this time, an output of the latched address signal of the node N31 is controlled by the address enable signal PRAR. That is, if the address enable signal PRAR is input as the logic "low" state, the NAND gates 54 and 55 output the signals of the logic "high" states regardless of the address signal of the node N31. Thus, if the address enable signal PRAR is not in a logic "high" state, the address signal of the node N31 is not output.

However, if the address enable signal PRAR is changed to the logic "high" state, the NAND gates 54 and 55 output NANDed signals, the logic states of which depend on the logic states of the address signal of the node 31 and the addresses signal inverted by the inverter 53.

If the address signal of the node N1 is the logic "high" state, the inverter 51 inverts the address signal of the node N1 to thereby output the signal of the logic "low" state to the node N31, and the NAND gate 54 NANDs the address signal with the node N31 and the address enable signal PRAR of the logic "high" state to thereby output the NANDed signal with a logic "high" state. The inverter 56 inverts the output of the NAND gate 56 to thereby yield the inverted result as the second row address input RAIB with a logic "low" state. Also, in a similar manner, the first row address input RAI output from the inverter 57 becomes the logic "high" state. Accordingly, the first row address input RAI and the second row address input RAIB have complementary logic states to each other.

In the conventional address buffer constructed as described above, all the address signals input therein are output during the same period. That is, the output of the address signal is determined according to a period of the address enable signal PRAR. Accordingly, first and second output address signals are enabled during the time when the address enable signal PRAR is maintained in the logic "high" state. As a result, the external address signal AI and the counter output CNT are output during the same period.

Generally, a dynamic random access memory is intended to operate at a high-speed by reducing a margin (time period) of the external address signal AI input in the normal mode, and performs the refresh operation of the memory cell by relatively increasing a margin of the counter output CNT input in the refresh mode. That is, the address margin of the refresh mode has to be longer than that of the normal mode. However, in the address buffer circuit as discussed above, the margins of the normal mode and the refresh mode have to be identically designated. In this case, the period of the address enable signal PRAR has to be designated as the margin of the refresh mode executed at a slow speed and therefore, the margin of the external address in the normal mode can not be relatively reduced. Thus, a limit is placed on high speed memory access in conventional devices.

SUMMARY OF THE INVENTION

Accordingly, it is an object of the present invention to provide an address buffer circuit capable of inputting addresses of different modes from each other in a semiconductor memory device in which a plurality of address signals for performing a plurality of modes are used.

It is another object of the present invention to provide an address buffer circuit capable of respectively inputting address signals of a normal mode and a CBR mode at different margins from each other in a dynamic random memory device performing normal and CBR modes.

It is still another object of the present invention to provide an address buffer circuit capable of respectively inputting address signals of the normal mode and a refresh mode at different margins from each other in the dynamic random access memory device executing normal and refresh modes.

To these and other objects, an address buffer circuit for a semiconductor memory device includes first and second address inputs which are selectably connectable to a first node according to first and second address input control signals, respectively. The device also includes first and second switches which are controlled by a refresh mode signal and selectively output a first or second address enable signal. Further, a latch is provided which latches the address signal input to the first node, and outputs the latched address signal in a periods of the selected first or second address enable signals.

BRIEF DESCRIPTION OF TEE DRAWINGS

The preferred embodiments of the present invention will now be described more specifically with reference to the attached drawings, wherein.

DETAILED DESCRIPTION OF THE PREFERRED EMBODIMENT

Figure 1:
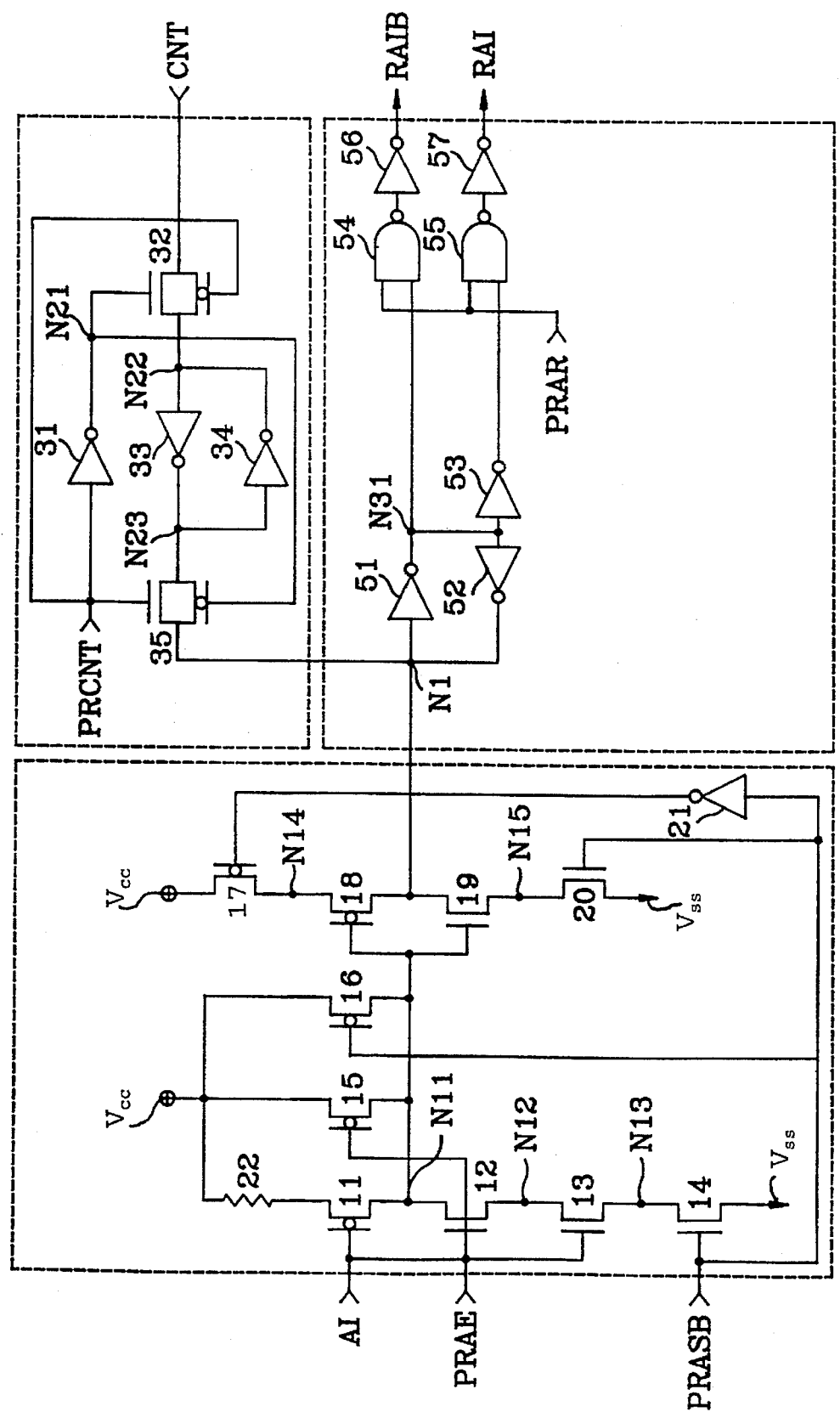
FIG. 1 is a circuit diagram illustrating a structure of an address buffer circuit of a conventional semiconductor memory device.

Hereinafter, as an example of a preferred embodiment of the present invention, a buffer circuit inputting addresses of the normal and refresh modes in a dynamic random access memory device will be described in detail. The address buffer circuit described hereinafter is a row address buffer circuit of a dynamic random access memory device. However, it will be understood by those skilled in the art that the present invention can be embodied by other buffer circuits.

Terms used to describe the present invention include those described hereinafter:

First logic refers to the logic "high" state.

Second logic refers to the logic "low" state.

An address input AI denotes the first address signal used as the address signal input from the exterior of the chip in order to select the memory cell.

A row address enable signal PRAE is used as a signal enabling the row address precharges an input terminal of the first address signal in the first logic state, and in the second logic state, releases the input terminal of the first address signal from the charged state. The row address enable signal PRAE is used as a first address input starting signal enabling an input of the first address signal at a point of being changed to the first logic state.

A row address strobe signal PRASB is used as a first address input ending signal forming a path for inputting the first address signal in the second logic state, and in the second logic state, cutting off the input path of the first address signal. The row address strobe signal PRASB designates a period (a first address input margin) during which an input of the first address signal is enabled while being maintained in the first logic state, after the row address enable signal PRAE is changed to the first logic state.

A row address reset signal PRARB is used as a first address enable signal cutting off the first address signal in the first logic state, and enabling an output of the first address signal in the second logic state. That is, the row address reset signal PRARB enables the output of the first address signal during the period maintained in the second logic state.

A row address reset signal of a CBR mode PRARB-CBR is used as a second address enable signal cutting off an output of the second address in the first logic state and enabling the output of the second address signal in the second logic state. That is, the row address reset signal of the CBR mode PRARB-CBR enables the output of the second address during a period maintained in the second logic state.

A refresh mode signal PRFHB is used as an address selecting signal forming a path for selecting the first address signal in the first logic state and a path for selecting the second address signal in the second logic state. That is, the refresh mode signal PRFHB selectively outputs either one of the first address signal and the second address signal according to the address mode.

A row count PRCNT is used as a second address input control signal enabling the input of the second address signal and cutting off the output thereof in the second logic state, and cutting off the input of the second address signal and enabling the input thereof in the first logic state.

A first row address input RAI is used as a first internal address signal.

A second row address input RAIB is used as a second internal address signal and has a complementary logic state to the logic state of the first internal address signal.

A counter output CNT denotes a second address signal as the refresh address signal output from the counter.

Low active signals are enabled in the logic "low" states, and the other signals are enabled in the logic "high" states.

Figure 2:
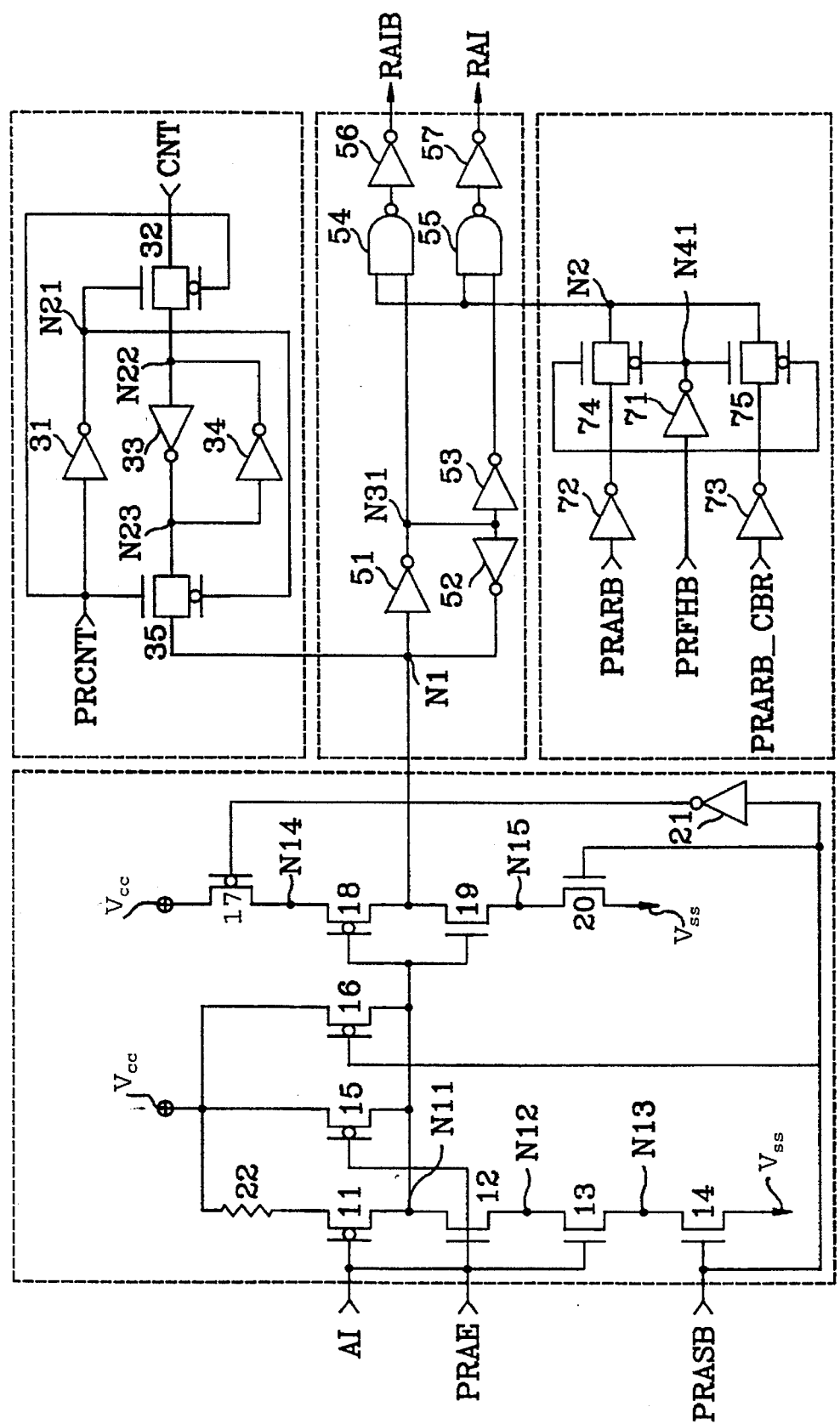
FIG. 2 is a circuit diagram illustrating a structure of an address buffer circuit of a semiconductor memory device constructed according to the principles of the present invention.

FIG. 2 shows the structure of the address buffer circuit in accordance with the present invention, wherein the first input and the second input are identical in structure as those described with respect to FIG. 1. Accordingly, a description of these portions of FIG. 2 will not be repeated.

An inverter 71 is connected to a node N41 at an output terminal thereof, and inverts the input refresh mode signal PRFHB to thereby output the inverted signal to the node N41. An inverter 72 inverts the input row address reset signal PRARB. An inverter 73 inverts the row address reset signal of CBR mode PRARB-CBR.

A transmission gate 74 includes NMOS and the PMOS transistors, which are connected between an output terminal of the inverter 72 and the node N2. In this transmission gate 74, a gate electrode of the NMOS transistor is connected to the refresh mode signal PRFHB, and a gate electrode of the PMOS transistor is connected to the output terminal of the inverter 71.

A transmission gate 75 includes a NMOS transistor and a PMOS transistor, which are connected between output terminal of the inverter 73 and the node N2. In this transmission gate 75, a gate electrode of the PMOS transistor is connected to the refresh mode signal PRFHB and a gate electrode of the NMOS transistor is connected to the output terminal of the inverter 71. The construction mentioned above is used to select the address mode and, at the same time, designating the address output period of the selected address mode.

The address output includes an inverter 51 is connected between the nodes N1 and N31, and an inverter 52 is connected between the nodes N31 and N1. The inverters 51 and 52 which are used as the latch, latch the address signal of the node N1 to the node N31. A NAND gate 54 inputs the address signal of the node N31 and the selected row address reset signal PRARB of the node N2 to thereby NAND the input signals. An inverter 53 inverters the address signal of the node N31. A NAND gate 55 inputs the output of the inverter 53 and the selected row address reset signal PRARB of the node N2 to thereby NAND the input signals. An inverter 56 inverts the output of the NAND gate 54 to thereby output the inverted result as the second row address input RAIB. An inverter 57 inverts the output of the NAND gate 55 to thereby output the inverted result as the first row address input RAI.

Figure 3:
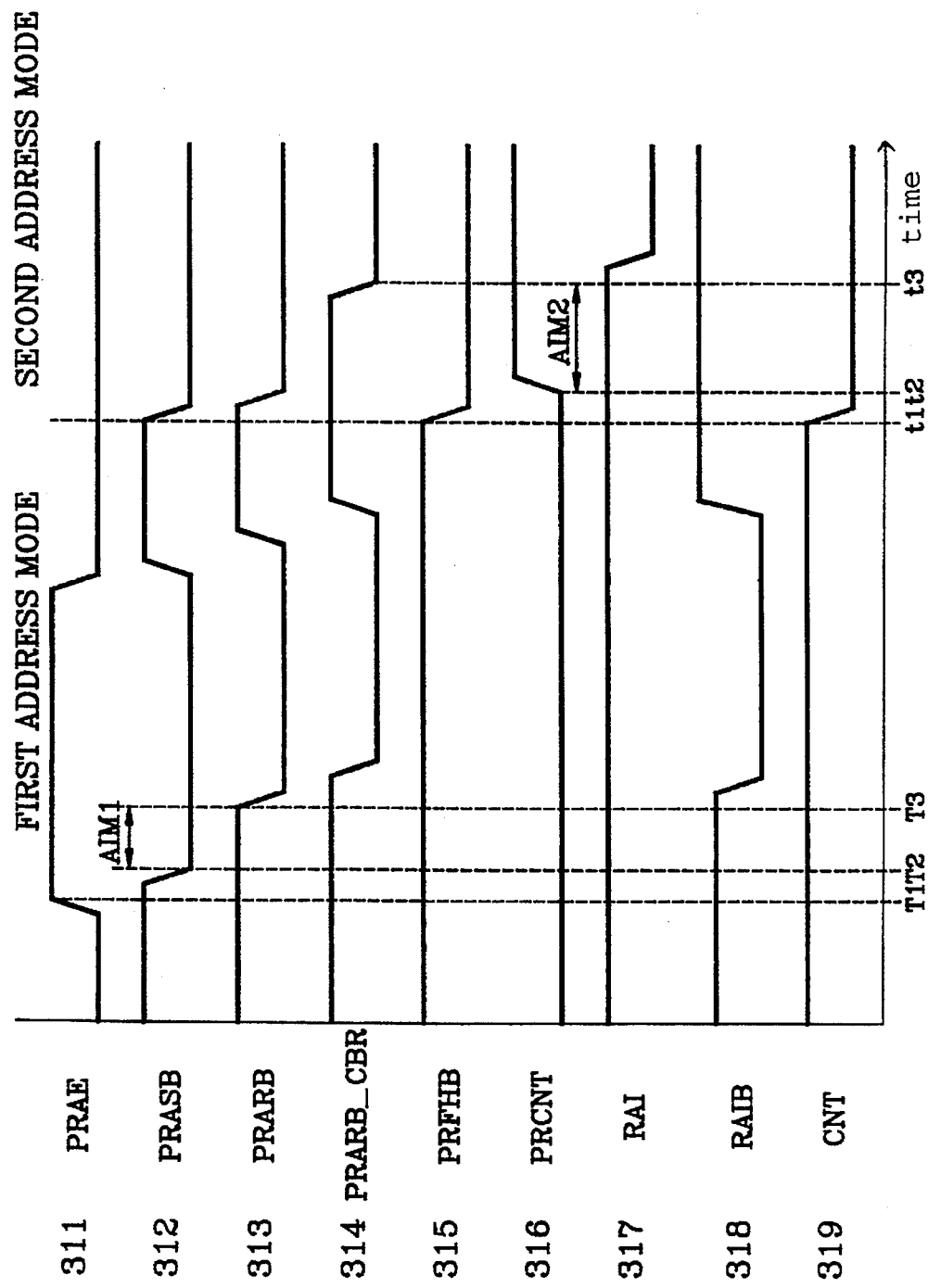
FIG. 3 is a view illustrating waveforms in accordance with operation characteristics of elements of FIG. 2.

FIG. 3 shows waveforms which illustrate characteristics of elements of FIG. 2, and illustrates the operation characteristics in normal and refresh modes.

Operation in normal and refresh modes will now be explained with reference to FIGS. 2 and 3.

Referring to the input procedure of the external address signal AI in the normal mode, the row count PRCNT is in the logic "low" state at the normal mode as shown in 316 of FIG. 3 and therefore, the transmission gates 32 and 35 are respectively turned on and off. Accordingly, the counter output CNT is in the latched state at the node N23 but the transmission gate 35 is in the turned-off state, and therefore the counter output CNT is not transmitted to the node N1. Therefore, the path of the counter output CNT maintains the cut-off state in the normal mode.

The refresh mode signal PRFHB is input as the logic "high" state in the normal mode as shown in 315 of the FIG. 3. And, the inverter 71 inverts the refresh mode signal PRFHB to be the logic "low" state at the node N41. Accordingly, the transmission gate 74 is turned on and the transmission gate 75 is turned off, and therefore the row address reset signal PRARB is transmitted to the node N2 and the path of the counter output CNT is cut off. At this time, the row address reset signal PRARB maintains the logic "high" state as shown in 313 of FIG. 3. Therefore, both NAND gates 54 and 55 output the logic "high" signals and accordingly, the first row address input RAI and the second row address input RAIB are output as the high impedance states.

In this state, the row address enable signal PRAE becomes the logic "low" state as shown in 311 of FIG. 3, and the row address strobe signal PRASB becomes the logic "high" state as shown in 312 of FIG. 3. The NMOS transistor 12 is turned on and the PMOS transistor 15 is turned off by the row address enable signal PRAE of the logic "low" state as shown in 311 of FIG. 3, and therefore the node N11 is charged to the power supply voltage $V_{CC}$ level. The NMOS transistor 12 is in the turned-off state, and the external address signal AI is not input. Further, the row address strobe signal PRASB is input as the logic "high" state as shown in 312 of FIG. 3, and therefore the PMOS transistor 16 is turned off and the NMOS transistor 20 is turned on. The PMOS transistor 17 which is connected to the inverter 21 at the gate electrode thereof is in the turned-on state and therefore, the potential of the power supply voltage $V_{CC}$ level is generated at the node N1.

If the row address enable signal PRAE is then changed to the logic "high" state at a point T1 as shown in 311 of FIG. 3, the NMOS transistor 12 is turned on and the PMOS transistor 15 is turned off and the input path of the external address signal AI is formed. The row address strobe signal PRASB maintains the logic "high" state at the point T1 as shown in 312 of FIG. 3 and therefore, the PMOS transistor 17 and the NMOS transistor 20 maintain the turned-on states. That is, if the external address signal AI is input as the logic "high" state, the PMOS transistor 11 is turned off and the NMOS transistor 13 is turned on, and therefore, the potential of the logic "low" level is generated at the node N11. The PMOS transistor 18 and the NMOS transistor 19 which have their gate electrodes connected in common to the node N11 are respectively turned on and off. Thereby, potential of the logic "low" level is generated at the node N1.

If the external address signal AI is input as the logic "low" state, the PMOS transistor 11 is turned on and the NMOS transistor 13 is turned off, and therefore, the potential of the power supply voltage $V_{CC}$ level is generated at the node N11. The PMOS transistor 18 and the NMOS transistor 19 which are connected in common to the node N11 at the gate electrodes thereof are thus respectively turned off and on to generate ground potential $V_{SS}$ at the node N1. Accordingly, if the row address enable signal PRAE is changed to the logic "high" state as shown in 311 of FIG. 3, the first input is enabled and thereby, a logic signal corresponding to the node N1 is generated according to the logic of the input external address signal AI. The external address signal AI of the node N1 is then latched to the node N31 by the inverters 51 and 52. However, since the row address reset signal PRARB at the node N2 has not been enabled as mentioned above, the external address of the node N1 is not output by the NAND gates 54 and 55.

If the row address strobe signal PRASB is then changed to the logic "low" state at a point T2, as shown in 312 of FIG. 3, the NMOS transistor 14 is turned off and the PMOS transistor 16 is turned on, and therefore, the input path of the external address signal AI is cut off and the node N11 is charged to the power supply voltage $V_{CC}$ level. The NMOS transistor 20 is also turned off and the PMOS transistor 17 is turned off by the inverter 21. Therefore, the paths of the first input and the node N1 are cut off. Accordingly, the input of the external address signal AI is enabled from the point that the row address enable signal PRAE is changed to the logic "high" state to the point that the row address strobe signal PRASB is changed to the logic "low" state, and in this period, the external address signal AI is input.

The external address signal AI input to the node N1 as described above is latched to the node N31 by the inverters 51 and 52. At this time, the output of the address signal of the node N31 is controlled by the row address reset signal PRARB output to the node N2. That is, if the row address reset signal PRARB is input as the logic "high" state, the potential of the logic "low" state is generated at the node N2 and thus, the NAND gates 54 and 55 output the signals of the logic "high" states regardless of the address signal of the node N31. In other words, when the row address reset signal PRARB is input as the logic "high" state, the address signal of the node N31 is not output. This period represented by a period AIM1 of FIG. 3 denotes the input margin of the external address signal AI. This period AIM1 is the margin for changing the external address signal AI input as a TTL level to the external address signal AI of a CMOS level. And, in this period AIM1, the signal of the TTL level is changed to the signal of the CMOS level by the inverters 51 and 52 operating as a latch. In this period AIM1, if the logic of the external address signal AI is not exactly designated, an invalid address may be generated at the point that the row address reset signal PRARB is changed to the logic "low" state. Accordingly, the external address input margin has to be designated in the proper time.

If the row address reset signal PRARB is changed to the logic "low" state at the point T3 as shown in 313 of FIG. 3, it is inverted into the logic "high" state by the inverter 72 to be output to the node N2. Then, the NAND gates 54 and 55 output the NANDed signal, logic states of which depend on the logic states of the address signal of the node N31 and the external address signal AI inverted by the inverter 53. At this time, if the external address signal AI of the node N1 is the logic "high" state, the inverter 51 inverts the external address signal AI of the node N1 to thereby output the inverted result as the logic "low" state to the node N31, and the NAND gate 54 NANDs the address signal of the node N31 and the row address reset signal PRARB of the logic "high" state and outputs the NANDed signal of the logic "high" state. Therefore, the inverter 56 inverts the output of the NANDgate 56 to thereby output the inverted result as the second row address input RAIB of the logic "low" state as shown in 318 of FIG. 3.

The first row address input RAI output from the inverter 57 in the this manner becomes the logic "high" state as shown in 317 of FIG. 3. Accordingly, the first and second row address inputs RAI and RAIB have complementary logic states to each other. The first row address input RAI and the second row address input RAIB form the inputs of a row decoder of the semiconductor memory device.

Referring to the operations in the refresh mode, the row address strobe signal PRASB is in the logic "low" state, as shown in 312 of FIG. 3, and therefore the PMOS transistor 17 and the NMOS transistor 20 are turned off. Accordingly, the first input becomes a non-active state and therefore, the first input becomes a high impedance state. Thereby, the input path of the external address signal AI is cut off. Furthermore, the refresh mode signal PRFHB is input as the logic "low" state in the normal mode as shown in 315 of FIG. 3. The inverter 71 inverts the refresh mode signal PRFHB to thereby output the inverted signal to the node N41, and accordingly the node N41 becomes the logic "high" state. Accordingly, the transmission gate 75 is turned on and the transmission gate 74 is turned off and therefore, the row address reset signal of the CBR mode PRARB-CBR is transmitted to the node N2 and the path of the row address reset signal PRARB is cut off. At this time, the row address reset signal of the CBR mode PRARB-CBR maintains the logic "high" state as shown in 314 of FIG. 3. Accordingly, the logic "low" signal inverted through the inverter 72 is generated at the node N2. Thereby, both NAND gates 54 and 55 output the logic "high" signals, and the first row address input RAI and the second row address input RAIB are output as the high impedance states.

At this time, if the row count PRCNT is input at a point t1 as shown in 316 of FIG. 3, the transmission gate 32 is turned on and the transmission gate 35 is turned off. Therefore, the transmission gate 32 transmits the input counter output CNT to the node N22, and the inverters 33 and 34 latch the counter output CNT transmitted to the node N22 to the node N23. At this time, the transmission gate 35 is in the turned-off state and therefore, the counter output CNT latched to the node N23 is cut off and not transmitted to the node N1.

If the row count PRCNT is then changed to the logic "high" state, at a point t2 as shown in 316 of FIG. 3, the transmission gate 32 is turned off and the transmission gate 35 is turned on. The transmission gate 32 then cuts off the input counter output CNT, and the transmission gate 35 transmits the counter output CNT latched to the node N23 to the node N1. At this time, the input margin AIM2 of the counter output CNT is designated to have a longer period than that of the external address signal AI. Accordingly, as shown in FIG. 3, after the row count PRCNT is changed to the logic "low" state, the period where the row address reset signal of the CBR mode PRARB-CBR is enabled to the logic "low" state becomes longer.

If the row address reset signal of the CBR mode PRARB-CBR is then changed to the logic "low" state at a point t3, as shown in 314 of FIG. 3, it is the inverted as the logic "low" state in the inverter 73 to be transmitted to the node N2. Then, the NAND gates 54 and 55 output NANDed signals of which logic states depend on the logic states of the address signal of the node N31 and the external address signal AI inverted by the inverter 53. Subsequential operations are performed in the same manner as operations in the normal mode. The output of the counter output CNT is maintained in the period where the row address reset signal of the CBR mode PRARB-CBR is maintained as the logic "low" state.

The address input buffer as previously discussed isolates the address input path for executing each mode in the semiconductor memory device executing a plurality of modes, thereby separately controlling the input speed of the address signal. Accordingly, there is an advantage in that the input of the address signal can be separately controlled at a proper speed according to the modes, thereby performing the operation of the semiconductor memory device at a high-speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An address buffer circuit of a semiconductor memory device executing at least two modes and accessing memory cells by using different address signals corresponding to said modes, said circuit comprising:

a first input which inputs a first address signal, and outputs said first address signal to a first node according to a first address input control signal;

a second input which inputs a second address signal, and outputs said second address signal to said first node according to a second address input control signal;

a first output including first and second switches, said first output inputting first and second address enable signals to said first and second switches respectively, and selectively outputting one of said first address enable signal and said second address enable signal by operating one of said first and second switches according to an address mode selecting signal;

a latch which holds first and second address signals input to said first node, and outputs a latched address signal corresponding thereto during a period of said one selected address enable signal.

2. The address buffer circuit as claimed in claim 1, wherein said first address input control signal denotes a enable signal designating a first margin for stabilizing an input of said first address signal, said second address input control signal denotes a enable signal designating a second margin for stabilizing an input of said second address signal, and said first and second address input control signals control input margins of said address signals according to different periods.

3. The address buffer circuit as claimed in claim 1, wherein said first address enable signal designates a period during which an output of said first address signal is enabled, said second address enable signal designates a period during which an output of said second address signal is enabled, and said first and second address enable signals control an output period of said selected address signal according to different periods.

4. The address buffer circuit as claimed in claim 3, wherein said semiconductor memory device is a dynamic random access memory device.

5. An address buffer circuit of a dynamic random memory access device for executing normal and refresh modes and accessing memory cells using different address signals corresponding to said normal and refresh modes, said circuit comprising:

a first input which inputs an external address signal, enables an input of said external address signal according to an external address input starting signal to thereby output the enabled input to a first node, and cuts off said external address signal output to said first node according to an external address ending signal;

a second input which inputs a refresh address signal and outputs said refresh address signal to said first node according to a second address input control signal;

a first output including a first switch and a second switch, which inputs an external address enable signal and a refresh address enable signal, and which selectively outputs either one of said external address enable signal and refresh address enable signal by operating the corresponding one of said first and second switches according to an address mode selecting signal; and an output which latches the address signal input to said first node, and outputs the latched address signal in a period of the selected address enable signal.

6. The address input buffer as claimed in claim 5, wherein said external address input starting signal and second address input ending signal designate a first margin for stabilizing an input of said external address signal, said second address control signal designates a second margin for stabilizing an input of said refresh address signal, and said first margin and said second margin have different periods.

7. The address input buffer as claimed in claim 6, wherein said external address input starting signal denotes a row address enable signal, and said external address input ending signal denotes a row address strobe signal.

8. The address buffer circuit as claimed in claim 5, wherein said external address enable signal designates a period enabling an output of said external address signal, said refresh address enable signal designates a period enabling an output of said refresh address signal, and said external address enable signal and refresh address enable signal control an output period of said selected address signal according to different periods.

9. The address buffer circuit as claimed in claim 8, wherein said external address enable signal is a row address reset signal, and said refresh address enable signal is a row address reset signal for a refreshment.

10. The address buffer circuit as claimed in claim 2, wherein said first address enable signal designates a period enabling an output of said first address signal, said second address enable signal designates a period enabling an output of said second address signal, and said first and second address enable signals control an output period of said selected address signal according to different periods.

11. The address buffer circuit as claimed in claim 10, wherein said semiconductor memory device is a dynamic random access memory device.

12. The address buffer circuit as claimed in claim 6, wherein said external address enable signal designates a period enabling an output of said external address signal, said refresh address enable signal designates a period enabling an output of said refresh address signal, and said external address enable signal and refresh address enable signal control an output period of said selected address signal according to different periods.

13. The address buffer circuit as claimed in claim 12, wherein said external address enable signal is a row address reset signal, and said refresh address enable signal is a row address reset signal for a refreshment.

* * * * *